(12) United States Patent
Yeisley et al.

(10) Patent No.: US 8,278,405 B2
(45) Date of Patent: Oct. 2, 2012

(54) VINYLPHENOXY POLYMERS

(75) Inventors: Shawn Yeisley, Newport, DE (US); Che-Hsiung Hsu, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 342 days.

(21) Appl. No.: 12/644,342

(22) Filed: Dec. 22, 2009

(65) Prior Publication Data

US 2010/0187509 A1 Jul. 29, 2010

Related U.S. Application Data

(60) Provisional application No. 61/139,784, filed on Dec. 22, 2008.

(51) Int. Cl.
*H01L 51/54* (2006.01)

(52) U.S. Cl. ...................................................... 526/287

(58) Field of Classification Search ........................ None
See application file for complete search history.

(56) References Cited

U.S. PATENT DOCUMENTS

| | | | |
|---|---|---|---|
| 3,282,875 A | 11/1966 | Connolly | |
| 4,358,545 A | 11/1982 | Ezzell et al. | |
| 4,940,525 A | 7/1990 | Ezzell et al. | |
| 5,463,005 A | 10/1995 | Desmarteau | |
| 5,993,694 A * | 11/1999 | Ito et al. | 252/500 |
| 6,303,238 B1 | 10/2001 | Thompson et al. | |
| 6,337,380 B1 * | 1/2002 | Sasaki et al. | 526/287 |
| 6,670,645 B2 | 12/2003 | Grushin et al. | |
| 2004/0127637 A1 | 7/2004 | Hsu et al. | |
| 2004/0254297 A1 | 12/2004 | Hsu et al. | |
| 2005/0205860 A1 | 9/2005 | Hsu et al. | |
| 2006/0178500 A1 * | 8/2006 | Kikuchi | 528/425 |
| 2007/0066755 A1 | 3/2007 | Hsu et al. | |
| 2007/0069184 A1 * | 3/2007 | Hsu et al. | 252/500 |

FOREIGN PATENT DOCUMENTS

| | | |
|---|---|---|
| WO | 00/70655 | 11/2000 |
| WO | 01/41512 A1 | 6/2001 |
| WO | 03/008424 A1 | 1/2003 |
| WO | 03/040257 A1 | 5/2003 |
| WO | 03/063555 A1 | 7/2003 |
| WO | 03/091688 A2 | 11/2003 |
| WO | 2004/016710 A1 | 2/2004 |

OTHER PUBLICATIONS

Tetrahedron, vol. 43, No. 6, pp. 1027-1062 (1987).
Macromolecules, 34, 5746-5747 (2001).
Macromolecules, 35, 7281-7286 (2002).
A Feiring et al, J Fluorine Chemistry 2000, 105, 129-135.
A Feiring el al, Macromolecules 2000, 33, 9262-9271.
DD Desmarteau, J Fluorine Chemistry, 1995, 72, 203-208.
AJ Appleby et al, J Electrochem. Soc, 1993, 140(1), 109-111.
Flexible Light-Emitting Diodes made from Soluble Conducting Polymer, Nature vol. 357, pp. 477-479 (Jun. 11, 1992).
Kirk-Othmer Encyclopedia of Chemical Technology, Fourth Edition, vol. 18, p. 837-860 Y. Wang) (Book Not Included); 2001.
CRC Handbook of Chemistry and Physics, 81$^{st}$ Edition (2001-2001) (Book Not Included).

* cited by examiner

*Primary Examiner* — Randy Gulakowski
*Assistant Examiner* — Jeffrey Washville

(57) ABSTRACT

There is provided a vinylphenoxy polymer having at least one monomeric unit selected from the group consisting of Formula Ia, Formula Ib and Formula Ic:

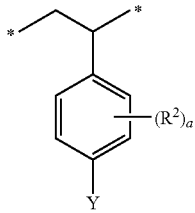
Formula Ia
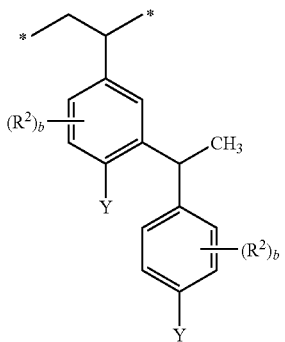
Formula Ib
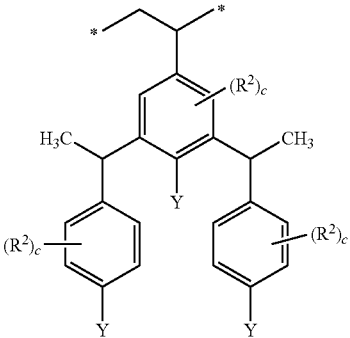
Formula Ic
In the formulae:
Y is —OR$^1$SO$_3$Z;
R$^1$ is an alkylene group having 1-10 carbon atoms;
R$^2$ is an alkyl group or alkoxy group;
Z is H or a Group 1 metal;
a is an integer from 0 to 4;
b is an integer from 0 to 3; and
c is an integer from 0 to 2.
19 Claims, 1 Drawing Sheet

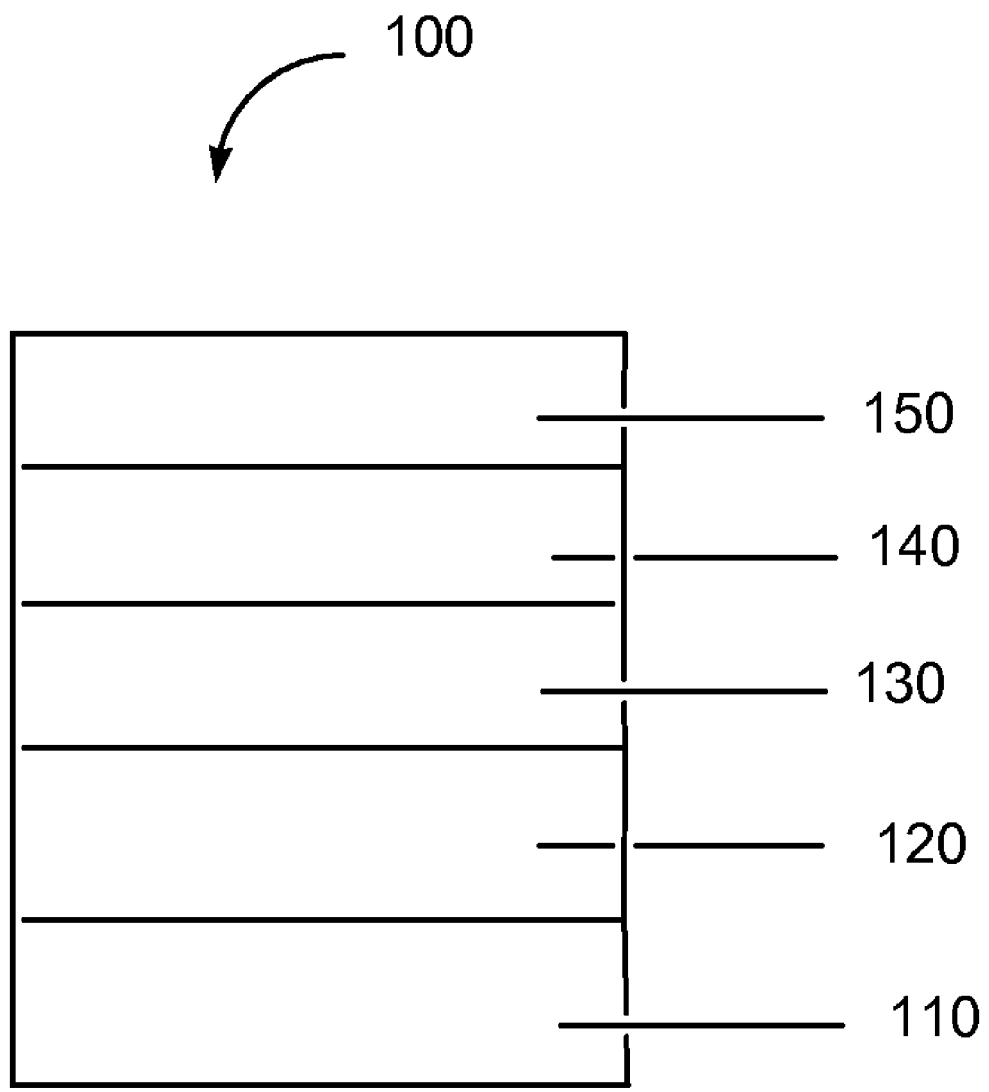

VINYLPHENOXY POLYMERS

RELATED APPLICATION

This application claims priority under 35 U.S.C. §119(e) from Provisional Application No. 61/139,784 filed Dec. 22, 2008 which is incorporated by reference in its entirety.

BACKGROUND INFORMATION

1. Field of the Disclosure

This disclosure relates in general to vinylphenoxy polymers, compositions made with such polymers, and their use in electronic devices.

2. Description of the Related Art

Electronic devices define a category of products that include an active layer. Organic electronic devices have at least one organic active layer. Such devices convert electrical energy into radiation such as light emitting diodes, detect signals through electronic processes, convert radiation into electrical energy, such as photovoltaic cells, or include one or more organic semiconductor layers.

Organic light-emitting diodes (OLEDs) are an organic electronic device comprising an organic layer capable of electroluminescence. OLEDs containing conducting polymers can have the following configuration:

anode/buffer layer/EL material/cathode with additional layers between the electrodes. The anode is typically any material that has the ability to inject holes into the EL material, such as, for example, indium/tin oxide (ITO). The anode is optionally supported on a glass or plastic substrate. EL materials include fluorescent compounds, fluorescent and phosphorescent metal complexes, conjugated polymers, and mixtures thereof. The cathode is typically any material (such as, e.g., Ca or Ba) that has the ability to inject electrons into the EL material. Electrically conducting polymers having low conductivity in the range of $10^{-3}$ to $10^{-7}$ S/cm are commonly used as the buffer layer in direct contact with an electrically conductive anode, such as ITO.

There is a continuing need for improved materials for electronic devices.

SUMMARY

There is provided a vinylphenoxy polymer having at least one monomeric unit selected from the group consisting of Formula Ia, Formula Ib and Formula Ic:

Formula Ia

Formula Ib

Formula Ic wherein:

Y is $\pm OR^1SO_3Z$;

$R^1$ is an alkylene group having 1-10 carbon atoms;

$R^2$ is the same or different at each occurrence and is selected from the group consisting of alkyl groups and alkoxy groups;

Z is selected from the group consisting of H and Group 1 metal cations;

a is an integer from 0 to 4;

b is an integer from 0 to 3; and c is an integer from 0 to 2.

In another embodiment, there is provided a composition comprising an electrically conductive polymer doped with the above polymer where Z=H.

In another embodiment, there is provided an organic electronic device comprising at least one active layer comprising the above composition.

BRIEF DESCRIPTION OF THE DRAWINGS

The invention is illustrated by way of example and not limitation in the accompanying figures.

FIG. 1 is a schematic diagram of an organic electronic device.

Skilled artisans will appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments are described herein and are merely exemplary and not limiting. After reading this specification, skilled artisans will appreciate that other aspects and embodiments are possible without departing from the scope of the invention.

Other features and benefits of any one or more of the embodiments will be apparent from the following detailed description, and from the claims. The detailed description first addresses Definitions and Clarification of Terms followed by the Vinylphenoxy Polymer, the Electrically Conductive Polymer Composition, Electronic Devices, and finally, Examples.

1. Definitions and Clarification of Terms

Before addressing details of embodiments described below, some terms are defined or clarified.

The term "acid polymer" refers to a polymer having acidic groups.

The term "acidic group" refers to a group capable of ionizing to donate a hydrogen ion to a Brønsted base.

As used herein, the term "alkyl" refers to a group derived from an aliphatic hydrocarbon and includes linear, branched and cyclic groups which may be unsubstituted or substituted. The term "heteroalkyl" is intended to mean an alkyl group, wherein one or more of the carbon atoms within the alkyl group has been replaced by another atom, such as nitrogen, oxygen, sulfur, and the like. The term "alkylene" refers to an alkyl group having two points of attachment.

As used herein, the term "alkenyl" refers to a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like. The term "alkenylene" refers to an alkenyl group having two points of attachment.

The term "buffer layer" or "buffer material" is intended to refer to electrically conductive or semiconductive layers or materials which may have one or more functions in an organic electronic device, including but not limited to, planarization of the underlying layer, charge transport and/or charge injection properties, scavenging of impurities such as oxygen or metal ions, and other aspects to facilitate or to improve the performance of an organic electronic device.

The term "conductor" and its variants are intended to refer to a layer material, member, or structure having an electrical property such that current flows through such layer material, member, or structure without a substantial drop in potential. The term is intended to include semiconductors. In some embodiments, a conductor will form a layer having a conductivity of at least $10^{-7}$ S/cm.

The term "doped" as it refers to an electrically conductive polymer, is intended to mean that the electrically conductive polymer has a polymeric counterion to balance the charge on the conductive polymer.

The term "doped conductive polymer" is intended to mean the conductive polymer and the polymeric counterion that is associated with it.

The term "electrically conductive" as it refers to a material, is intended to mean a material which is inherently or intrinsically capable of electrical conductivity without the addition of carbon black or conductive metal particles.

The term "electron transport" means when referring to a layer, material, member or structure, such a layer, material, member or structure that promotes or facilitates migration of negative charges through such a layer, material, member or structure into another layer, material, member or structure.

The terms "fully-fluorinated" and "perfluorinated" are used interchangeably and refer to a compound where all of the available hydrogens bonded to carbon have been replaced by fluorine.

The term "highly-fluorinated" refers to a compound in which at least 90% of the available hydrogens bonded to carbon have been replaced by fluorine.

The term "hole transport" when referring to a layer, material, member, or structure, is intended to mean such layer, material, member, or structure facilitates migration of positive charges through the thickness of such layer, material, member, or structure with relative efficiency and small loss of charge.

The term "layer" is used interchangeably with the term "film" and refers to a coating covering a desired area. The term is not limited by size. The area can be as large as an entire device or as small as a specific functional area such as the actual visual display, or as small as a single sub-pixel. Unless otherwise indicated, layers and films can be formed by any conventional deposition technique, including vapor deposition, liquid deposition (continuous and discontinuous techniques), and thermal transfer.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

The term "polymer" is intended to mean a material having at least one repeating monomeric unit. The term includes homopolymers having only one kind, or species, of monomeric unit, and copolymers having two or more different monomeric units, including copolymers formed from monomeric units of different species.

Although light-emitting materials may also have some charge transport properties, the terms "hole transport layer, material, member, or structure" and "electron transport layer, material, member, or structure" are not intended to include a layer, material, member, or structure whose primary function is light emission.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. In the Formulae, the letters E, G, Q, R, T, W, X, Y, and Z are used to designate atoms or groups which are defined within. All other letters are used to designate conventional atomic symbols. Group numbers corresponding to columns within the Periodic Table of the elements use the "New Notation" convention as seen in the *CRC Handbook of Chemistry and Physics,* 81st Edition (2000).

To the extent not described herein, many details regarding specific materials, processing acts, and circuits are conventional and may be found in textbooks and other sources within the organic light-emitting diode display, lighting source, photodetector, photovoltaic, and semiconductive member arts.

2. Vinylphenoxy Polymer

There is provided a vinylphenoxy polymer having at least one monomeric unit selected from the group consisting of Formula Ia, Formula Ib and Formula Ic:

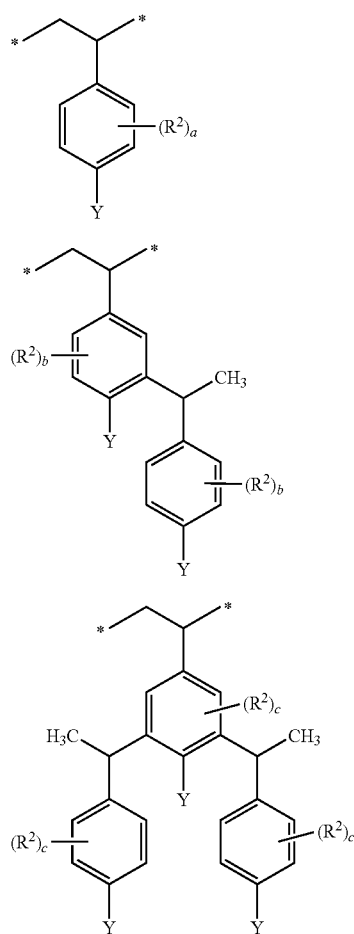

Formula Ia

Formula Ib

Formula Ic wherein:
Y is —OR$^1$SO$_3$Z;
R$^1$ is an alkylene group having 1-10 carbon atoms;
R$^2$ is the same or different at each occurrence and is selected from the group consisting of alkyl groups and alkoxy groups;
Z is selected from the group consisting of H and Group 1 metal cations;
a is an integer from 0 to 4;
b is an integer from 0 to 3; and
c is an integer from 0 to 2.

Formula Ia, Formula Ib and Formula Ic are referred to collectively herein as Formula I.

In some embodiments, the polymer is a homopolymer having Formula IIa, Formula IIb, or Formula IIc:

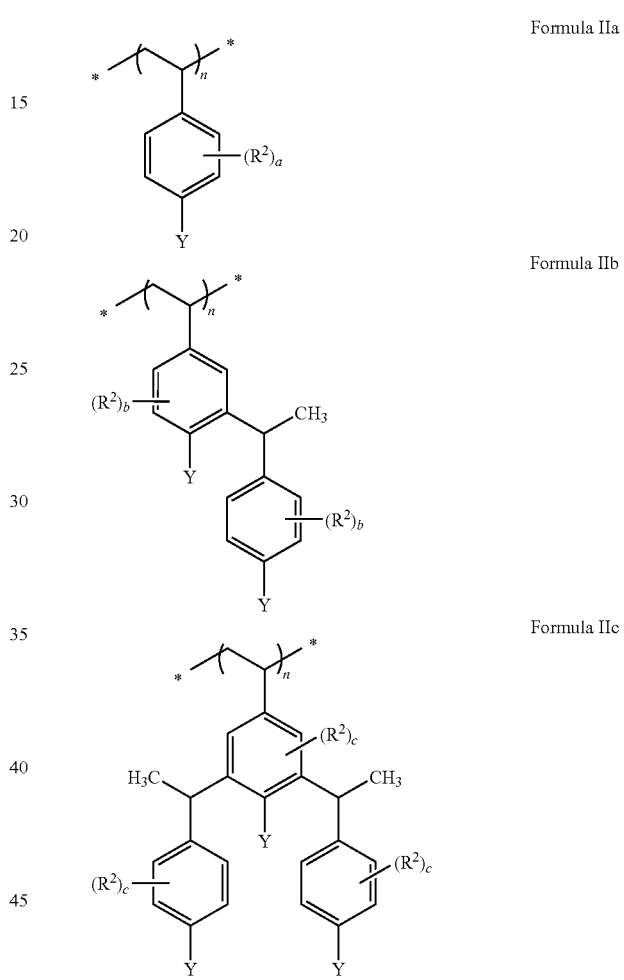

Formula IIa

Formula IIb

Formula IIc where n is at least 5 and R$^1$, R$^2$, Y, Z, a, b, and c are as defined above. Formula IIa, Formula IIb and Formula IIc are referred to collectively herein as Formula II.

In some embodiments, the homopolymers have monomeric units of Formula Ia and/or Formula Ib and/or Formula Ic.

In some embodiments, the polymer is a copolymer. In some embodiments, the copolymer is made of two or more different monomeric units having Formula I (monomeric unit of Formula Ia and Ib, or monomeric units of Formula Ia or Ib or Ic in which substituents are different between, e.g., the two or more Ia comonomers), and may also in some embodiments include variant Formula Ia comonomers and one or more variant Formula Ia and/or Ic comonomers. In some embodiments, the copolymer is made of at least one monomeric unit having Formula I and at least one second type of monomeric unit having a different formula. In some embodiments, the second type of monomeric unit includes an acidic group.

Examples of other monomeric units having acidic groups include, but are not limited to, monomeric units derived from styrene sulfonic acid, acrylamidomethansulfonic acid, and sulfonated acrylates and methacrylates.

In some embodiments of Formula I, $R^1$ has 3-5 carbon atoms.

In some embodiments of Formula Ia, a=1 and $R^2$ is an alkyl having 1-10 carbons.

In some embodiments of Formula Ib, b=1 and $R^2$ is an alkyl having 1-10 carbons.

In some embodiments of Formula Ic, c=1 and $R^2$ is an alkyl having 1-10 carbons.

In some embodiments of Formula I, a=b=c=0.

In some embodiments of Formula I, Z is selected from H and Li.

a. Preparation of the Vinylphenoxy Polymer

The polymers described herein can generally be prepared by first forming the poly(4-vinylphenol) and then reacting this with the appropriate sultone. As used herein, the term "sultone" indicates a cyclic ester of a hydroxylsulfonic acid. Polyvinylphenols are well known, and in some cases commercially available. The preparation of sultones has been reviewed extensively, for example, in Tetrandron, Vol. 43, No. 6, pp 1027-1062 (1987). Some sultones, such as 1,3-propane sultone, are commercially available.

An example of the reaction scheme is shown below with 1,3-propane sultone.

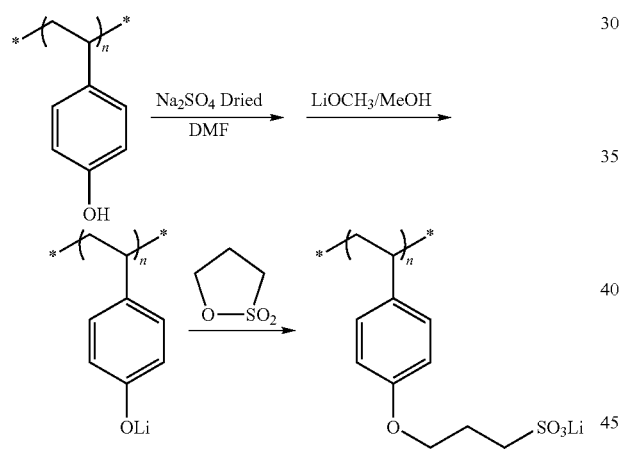

The vinylphenoxy sulfonic acid polymer can be formed by treating the lithium salt with acid. The synthesis is further illustrated in the examples.

3. Electrically Conductive Polymer Composition

In another embodiment, there is provided a composition comprising an electrically conductive polymer doped with the above vinylphenoxy sulfonic acid polymer.

a. Electrically Conductive Polymer

Any electrically conductive polymer can be used in the new composition. In some embodiments, the electrically conductive polymer will form a film which has a conductivity greater than $10^{-7}$ S/cm.

The conductive polymers suitable for the new composition are made from at least one monomer which, when polymerized alone, forms an electrically conductive homopolymer. Such monomers are referred to herein as "conductive precursor monomers." Monomers which, when polymerized alone form homopolymers which are not electrically conductive, are referred to as "non-conductive precursor monomers." The conductive polymer can be a homopolymer or a copolymer. Conductive copolymers suitable for the new composition can be made from two or more conductive precursor monomers or from a combination of one or more conductive precursor monomers and one or more non-conductive precursor monomers.

In some embodiments, the conductive polymer is made from at least one precursor monomer selected from thiophenes, selenophenes, tellurophenes, pyrroles, anilines, 4-amino-indoles, 7-amino-indoles, and polycyclic aromatics. The polymers made from these monomers are referred to herein as polythiophenes, poly(selenophenes), poly(tellurophenes), polypyrroles, polyanilines, poly(4-amino-indoles), poly(7-amino-indoles), and polycyclic aromatic polymers, respectively. The term "polycyclic aromatic" refers to compounds having more than one aromatic ring. The rings may be joined by one or more bonds, or they may be fused together. The term "aromatic ring" is intended to include heteroaromatic rings. A "polycyclic heteroaromatic" compound has at least one heteroaromatic ring. In some embodiments, the polycyclic aromatic polymers are poly (thienothiophenes).

In some embodiments, monomers contemplated for use to form the electrically conductive polymer in the new composition comprise Formula III below:

wherein:

Q is selected from the group consisting of S, Se, and Te;

$R^3$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^3$ groups together may form an alkylene or alkenylene chain completing a 3, 4, 5, 6, or 7-membered aromatic or alicyclic ring, which ring may optionally include one or more divalent nitrogen, selenium, tellurium, sulfur or oxygen atoms.

As used herein, the following terms for substituent groups refer to the formulae given below:

"alcohol" —$R^a$—OH

"amido" —$R^a$—C(O)N($R^d$)$R^d$

"amidosulfonate" —$R^a$—C(O)N($R^d$)$R^b$—SO$_3$Y'

"benzyl" —CH$_2$—C$_6$H$_5$

"carboxylate" —$R^a$—C(O)O—Y' or —$R^a$—O—C(O)—Y'

"ether" —$R^a$—(O—$R^c$)$_p$—O—$R^c$

"ether carboxylate" —$R^a$—O—$R^b$—C(O)O—Y' or
—$R^a$—O—$R^b$—O—C(O)—Y'

"ether sulfonate" —$R^a$—O—$R^b$—$SO_3$Y'

"ester sulfonate" —$R^a$—O—C(O)—$R^b$—$SO_3$Y'

"sulfonimide" —$R^a$—$SO_2$—NH—$SO_2$—$R^c$

"urethane" —$R^a$—O—C(O)—N$(R^d)_2$ where all "R" groups are the same or different at each occurrence and:
$R^a$ is a single bond or an alkylene group
$R^b$ is an alkylene group
$R^c$ is an alkyl group
$R^d$ is hydrogen or an alkyl group
p is 0 or an integer from 1 to 20
Y' is H, alkali metal, alkaline earth metal, N$(R^c)_4$ or $R^c$ Any of the above groups may further be unsubstituted or substituted, and any group may have F substituted for one or more hydrogens, including perfluorinated groups. In one embodiment, the alkyl and alkylene groups have from 1-20 carbon atoms.

In some embodiments, in the monomer, both $R^3$ together form —W—$(CR^4R^5)_m$—W—, where m is 2 or 3, W is O, S, Se, PO, $NR^6$, $R^4$ is the same or different at each occurrence and is hydrogen or fluorine, $R^5$ is the same or different at each occurrence and is selected from hydrogen, halogen, alkyl, alcohol, amidosulfonate, benzyl, carboxylate, ether, ether carboxylate, ether sulfonate, ester sulfonate, and urethane, $R^6$ is hydrogen or alkyl, and where the $R^4R^5$ groups may be partially or fully fluorinated. In some embodiments, all R are hydrogen. In some embodiments, the polymer is poly(3,4-ethylenedioxythiophene). In some embodiments, at least one $R^4$ or $R^5$ group is not hydrogen. In some embodiments, at least one $R^4$ or $R^5$ group is a substituent having F substituted for at least one hydrogen. In some embodiments, at least one $R^4$ or $R^5$ group is perfluorinated.

In some embodiments, the monomer has Formula III(a):

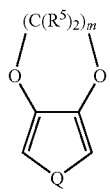

(III(a))

wherein:
Q is selected from the group consisting of S, Se, and Te;
$R^5$ is the same or different at each occurrence and is selected from hydrogen, alkyl, heteroalkyl, alkenyl, heteroalkenyl, alcohol, amidosulfonate, benzyl, carboxylate, ether, ether carboxylate, ether sulfonate, ester sulfonate, and urethane, with the proviso that at least one $R^5$ is not hydrogen, and
m is 2 or 3.

In some embodiments of Formula III(a), m is two, one $R^5$ is an alkyl group of more than 5 carbon atoms, and all other $R^5$ are hydrogen. In some embodiments of Formula III(a), at least one $R^5$ group is fluorinated. In some embodiments, at least one $R^5$ group has at least one fluorine substituent. In some embodiments, the $R^5$ group is fully fluorinated.

In some embodiments of Formula III(a), the $R^5$ substituents on the fused alicyclic ring on the monomer offer improved solubility of the monomers in water and facilitate polymerization in the presence of the fluorinated acid polymer.

In some embodiments of Formula III(a), m is 2, one $R^5$ is sulfonic acid-propylene-ether-methylene and all other $R^5$ are hydrogen. In some embodiments, m is 2, one $R^5$ is propyl-ether-ethylene and all other $R^5$ are hydrogen. In some embodiments, m is 2, one $R^5$ is methoxy and all other $R^5$ are hydrogen. In some embodiments, one $R^5$ is sulfonic acid difluoromethylene ester methylene (—$CH_2$—O—C(O)—$CF_2$—$SO_3$H), and all other $R^5$ are hydrogen.

In some embodiments, pyrrole monomers contemplated for use to form the electrically conductive polymer in the new composition comprise Formula IV below.

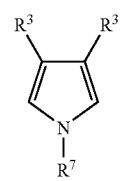

(IV)

where in Formula IV:
$R^3$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, amidosulfonate, ether carboxylate, ether sulfonate, ester sulfonate, and urethane; or both $R^3$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms; and
$R^7$ is independently selected so as to be the same or different at each occurrence and is selected from hydrogen, alkyl, alkenyl, aryl, alkanoyl, alkylthioalkyl, alkylaryl, arylalkyl, amino, epoxy, silane, siloxane, alcohol, benzyl, carboxylate, ether, ether carboxylate, ether sulfonate, ester sulfonate, and urethane.

In some embodiments, $R^3$ is the same or different at each occurrence and is independently selected from hydrogen, alkyl, alkenyl, alkoxy, cycloalkyl, cycloalkenyl, alcohol, benzyl, carboxylate, ether, amidosulfonate, ether carboxylate, ether sulfonate, ester sulfonate, urethane, epoxy, silane, siloxane, and alkyl substituted with one or more of sulfonic acid, carboxylic acid, acrylic acid, phosphoric acid, phosphonic acid, halogen, nitro, cyano, hydroxyl, epoxy, silane, or siloxane moieties.

In some embodiments, $R^7$ is selected from hydrogen, alkyl, and alkyl substituted with one or more of sulfonic acid, carboxylic acid, acrylic acid, phosphoric acid, phosphonic acid, halogen, cyano, hydroxyl, epoxy, silane, or siloxane moieties.

In some embodiments, the pyrrole monomer is unsubstituted and both $R^3$ and $R^7$ are hydrogen.

In some embodiments, both $R^3$ together form a 6- or 7-membered alicyclic ring, which is further substituted with a group selected from alkyl, heteroalkyl, alcohol, benzyl, carboxylate, ether, ether carboxylate, ether sulfonate, ester sulfonate, and urethane. These groups can improve the solubility of the monomer and the resulting polymer. In some embodiments, both $R^3$ together form a 6- or 7-membered alicyclic ring, which is further substituted with an alkyl group. In some embodiments, both $R^1$ together form a 6- or 7-membered alicyclic ring, which is further substituted with an alkyl group having at least 1 carbon atom.

In some embodiments, both $R^3$ together form —O—$(CHR^5)_m$—O—, where m is 2 or 3, and $R^5$ is the same or different at each occurrence and is selected from hydrogen, halogen, alkyl, alcohol, benzyl, carboxylate, amidosulfonate, ether, ether carboxylate, ether sulfonate, ester sulfonate, and urethane. In some embodiments, at least one $R^5$ group is not hydrogen. In some embodiments, at least one $R^5$ group is a substituent having F substituted for at least one hydrogen. In some embodiments, at least one $R^5$ group is perfluorinated.

In some embodiments, aniline monomers contemplated for use to form the electrically conductive polymer in the new composition comprise Formula V below.

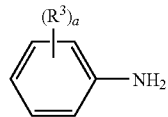

(V)

wherein:

a is an integer from 0 to 4; and $R^3$ is independently selected so as to be the same or different at each occurrence and is selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, cyano, hydroxyl, epoxy, silane, siloxane, alcohol, benzyl, carboxylate, ether, ether carboxylate, amidosulfonate, ether sulfonate, ester sulfonate, and urethane; or both $R^3$ groups together may form an alkylene or alkenylene chain completing a 3, 4, 5, 6, or 7-membered aromatic or alicyclic ring, which ring may optionally include one or more divalent nitrogen, sulfur or oxygen atoms.

When polymerized, the aniline monomeric unit can have Formula V(a) or Formula V(b) shown below, or a combination of both formulae.

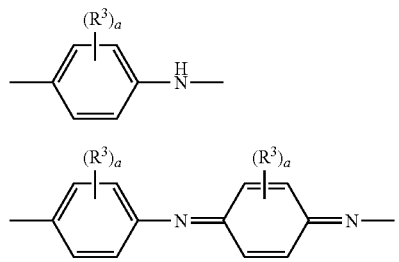

where a and $R^3$ are as defined above.

In some embodiments, the aniline monomer is unsubstituted and a=0.

In some embodiments, a is not 0 and at least one $R^3$ is fluorinated. In some embodiments, at least one $R^3$ is perfluorinated.

In some embodiments, fused polycyclic heteroaromatic monomers contemplated for use to form the electrically conductive polymer in the new composition have two or more fused aromatic rings, at least one of which is heteroaromatic. In some embodiments, the fused polycyclic heteroaromatic monomer has Formula VI:

(VI)

wherein:

Q is S, Se, Te, or $NR^6$;

$R^6$ is hydrogen or alkyl;

$R^8$, $R^9$, $R^{10}$, and $R^{11}$ are independently selected so as to be the same or different at each occurrence and are selected from hydrogen, alkyl, alkenyl, alkoxy, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; and at least one of $R^8$ and $R^9$, $R^9$ and $R^{10}$, and $R^{10}$ and $R^{11}$ together form an alkenylene chain completing a 5 or 6-membered aromatic ring, which ring may optionally include one or more divalent nitrogen, sulfur, selenium, tellurium, or oxygen atoms.

In some embodiments, the fused polycyclic heteroaromatic monomer has a formula selected from the group consisting of Formula VI(a), VI(b), VI(c), VI(d), VI(e), VI(f), VI(g), VI(h), VI(i), VI(j), and VI(k):

VI(a)

VI(b)

VI(c) 

VI(d) 

VI(e) 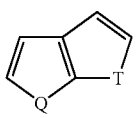

VI(f) 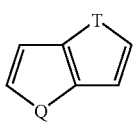

VI(g) 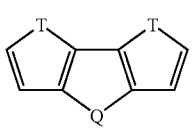

VI(h) 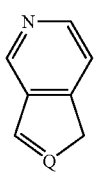

VI(i) 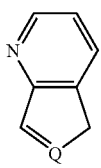

VI(j) 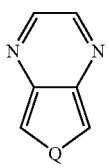

VI(k) 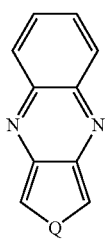

wherein:

Q is S, Se, Te, or NH; and

T is the same or different at each occurrence and is selected from S, $NR^6$, O, $SiR^6{}_2$, Se, Te, and $PR^6$; and $R^6$ is hydrogen or alkyl.

The fused polycyclic heteroaromatic monomers may be further substituted with groups selected from alkyl, heteroalkyl, alcohol, benzyl, carboxylate, ether, ether carboxylate, ether sulfonate, ester sulfonate, and urethane. In some embodiments, the substituent groups are fluorinated. In some embodiments, the substituent groups are fully fluorinated.

In some embodiments, the fused polycyclic heteroaromatic monomer is a thieno(thiophene). Such compounds have been discussed in, for example, Macromolecules, 34, 5746-5747 (2001); and Macromolecules, 35, 7281-7286 (2002). In some embodiments, the thieno(thiophene) is selected from thieno(2,3-b)thiophene, thieno(3,2-b) thiophene, and thieno(3,4-b)thiophene. In some embodiments, the thieno(thiophene) monomer is further substituted with at least one group selected from alkyl, heteroalkyl, alcohol, benzyl, carboxylate, ether, ether carboxylate, ether sulfonate, ester sulfonate, and urethane. In some embodiments, the substituent groups are fluorinated. In some embodiments, the substituent groups are fully fluorinated.

In some embodiments, polycyclic heteroaromatic monomers contemplated for use to form the polymer in the new composition comprise Formula VII:

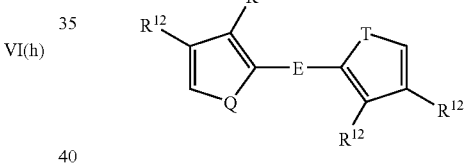

(VII)

wherein:

Q is S, Se, Te, or $NR^6$;

T is selected from S, $NR^6$, O, $SiR^6{}_2$, Se, Te, and $PR^6$;

E is selected from alkenylene, arylene, and heteroarylene;

$R^6$ is hydrogen or alkyl;

$R^{12}$ is the same or different at each occurrence and is selected from hydrogen, alkyl, alkenyl, alkoxy, alkanoyl, alkylthio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, acrylic acid, phosphoric acid, phosphonic acid, halogen, nitro, nitrile, cyano, hydroxyl, epoxy, silane, siloxane, alcohol, benzyl, carboxylate, ether, ether carboxylate, amidosulfonate, ether sulfonate, ester sulfonate, and urethane; or both $R^{12}$ groups together may form an alkylene or alkenylene chain completing a 3, 4, 5, 6, or 7-membered aromatic or alicyclic ring, which ring may optionally include one or more divalent nitrogen, sulfur, selenium, tellurium, or oxygen atoms.

In some embodiments, monomers contemplated for use to form the electrically conductive polymer in the new composition comprise Formula VIII:

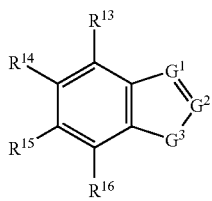

(VIII)

where:

$G^1$=N, $CR^{17}$ $G^2$=N, $CR^{17}$ $G^3$=NH, S, O, Se, Te;

$R^{13}$ through $R^{16}$ are the same or different and are selected from the group consisting of H, F, Cl, $C_1$-$C_{24}$ alkyl, $C_2$-$C_{24}$ alkenyl, aryl, $C_1$-$C_{10}$ alkoxy, $C_1$-$C_{10}$ alkylseleno, $C_1$-$C_{10}$ alkylthio, $C_1$-$C_{10}$ alkylsilyl, $NH_2$, and $C_1$-$C_{10}$ dialkylamino, where adjacent R groups can join together to form a 5- or 6-membered aliphatic or aromatic rings, with the proviso that at least one of $R^{13}$ through $R^{16}$ is $NH_2$, and $R^{17}$ is the same or different at each occurrence and is selected from the group consisting of H, $C_1$-$C_{24}$ alkyl, $C_2$-$C_{24}$ alkenyl, and aryl.

In some embodiments, the monomer is selected from the group consisting of Formulae VIII(a) through VIII(f):

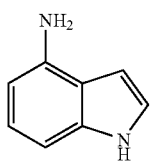
VIII(a)

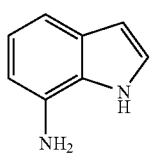
VIII(b)

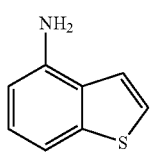
VIII(c)

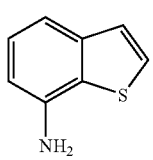
VIII(d)

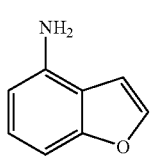
VIII(e)

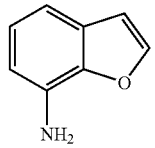
VIII(f)

In some embodiments, the electrically conductive polymer is a copolymer of a precursor monomer and at least one second monomer. Any type of second monomer can be used, so long as it does not detrimentally affect the desired properties of the copolymer. In some embodiments, the second monomer comprises no more than 50% of the polymer, based on the total number of monomer units. In some embodiments, the second monomer comprises no more than 30%, based on the total number of monomer units. In some embodiments, the second monomer comprises no more than 10%, based on the total number of monomer units.

Exemplary types of second monomers include, but are not limited to, alkenyl, alkynyl, arylene, and heteroarylene. Examples of second monomers include, but are not limited to, fluorene, oxadiazole, thiadiazole, benzothiadiazole, phenylenevinylene, phenyleneethynylene, pyridine, diazines, and triazines, all of which may be further substituted.

In some embodiments, the copolymers are made by first forming an intermediate precursor monomer having the structure A-B-C, where A and C represent precursor monomers, which can be the same or different, and B represents a second monomer. The A-B-C intermediate precursor monomer can be prepared using standard synthetic organic techniques, such as Yamamoto, Stille, Grignard metathesis, Suzuki, and Negishi couplings. The copolymer is then formed by oxidative polymerization of the intermediate precursor monomer alone, or with one or more additional precursor monomers.

In some embodiments, the electrically conductive polymer is selected from the group consisting of a polythiophene, a polypyrrole, a poly(4-amino-indole), a poly(7-amino-indole), polymeric fused polycyclic heteroaromatic, a copolymer thereof, and combinations thereof.

In some embodiments, the electrically conductive polymer is selected from the group consisting of unsubstituted polyaniline, poly(3,4-ethylenedioxythiophene), poly(3,4-ethyleneoxythiathiophene), poly(3,4-ethylenedithiathiophene), unsubstituted polypyrrole, poly(thieno(2,3-b)thiophene), poly(thieno(3,2-b)thiophene), and poly(thieno(3,4-b)thiophene).

b. Preparation of Doped Electrically Conductive Polymer

In one embodiment, the doped electrically conductive polymer composition is formed by the oxidative polymerization of the conductive precursor monomer(s) in the presence of the vinylphenoxy polymer in the acid form. The poly(vinylphenoxy)sulfonic acid is referred to herein as "PVPSA". In one embodiment, the precursor monomer comprises two or more conductive precursor monomers. In one embodiment, the precursor monomers comprise one or more intermediate precursor monomers. In one embodiment, the precursor monomers comprise one or more conductive precursor monomers and one or more intermediate precursor monomers. For convenience, the discussion below will refer to a single conductive monomer, with the understanding that more than one monomer may be present.

In one embodiment, the oxidative polymerization is carried out in a homogeneous aqueous solution. In another embodiment, the oxidative polymerization is carried out in an emulsion of water and an organic solvent. In general, some water is present in order to obtain adequate solubility of the oxidizing agent and/or catalyst. Oxidizing agents such as ammonium persulfate, sodium persulfate, potassium persulfate, and the like, can be used. A catalyst, such as ferric chloride, or ferric sulfate may also be present. In general, the concentration of catalyst is very low. The resulting polymerized product will be a solution, dispersion, or emulsion of the conductive polymer in association with the PVPSA. In one embodiment, the electrically conductive polymer is positively charged, and the charges are balanced by the PVPSA anion.

In one embodiment, the method of making an aqueous solutions or dispersion of the new conductive polymer composition includes forming a reaction mixture by combining water, conductive precursor monomer, at least one PVPSA, and an oxidizing agent, in any order, provided that at least a portion of the PVPSA is present when the precursor monomer and the oxidizing agent are added.

In one embodiment, the method of making the new conductive polymer composition comprises:

(a) providing an aqueous solution or dispersion of a PVPSA;

(b) adding an oxidizer to the solutions or dispersion of step (a); and (c) adding the precursor monomer to the mixture of step (b).

In another embodiment, the precursor monomer is added to the aqueous solution or dispersion of the PVPSA prior to adding the oxidizer. Step (b) above, which is adding oxidizing agent, is then carried out.

In another embodiment, a mixture of water and the precursor monomer is formed, in a concentration typically in the range of about 0.5% by weight to about 4.0% by weight total precursor monomer. This precursor monomer mixture is added to the aqueous solution or dispersion of the PVPSA, and step (b) above, which is adding oxidizing agent, is carried out.

In another embodiment, the aqueous polymerization mixture may include a polymerization catalyst, such as ferric sulfate, ferric chloride, and the like. The catalyst is added before the last step. In another embodiment, a catalyst is added together with an oxidizing agent.

In one embodiment, the polymerization is carried out in the presence of co-dispersing liquids which are miscible with water. Examples of suitable co-dispersing liquids include, but are not limited to ethers, alcohols, alcohol ethers, cyclic ethers, ketones, nitriles, sulfoxides, amides, and combinations thereof. In one embodiment, the co-dispersing liquid is an alcohol. In one embodiment, the co-dispersing liquid is an organic solvent selected from n-propanol, isopropanol, t-butanol, dimethylacetamide, dimethylformamide, N-methylpyrrolidone, and mixtures thereof. In general, the amount of co-dispersing liquid should be less than about 60% by volume. In one embodiment, the amount of co-dispersing liquid is less than about 30% by volume. In one embodiment, the amount of co-dispersing liquid is between 5 and 50% by volume. The use of a co-dispersing liquid in the polymerization significantly reduces particle size and improves filterability of the dispersions. In addition, buffer materials obtained by this process show an increased viscosity and films prepared from these dispersions are of high quality.

The co-dispersing liquid can be added to the reaction mixture at any point in the process.

In one embodiment, the polymerization is carried out in the presence of a co-acid which is a Brønsted acid. The acid can be an inorganic acid, such as HCl, sulfuric acid, and the like, or an organic acid, such as acetic acid or p-toluenesulfonic acid. Combinations of acids can be used.

The co-acid can be added to the reaction mixture at any point in the process prior to the addition of either the oxidizer or the precursor monomer, whichever is added last. In one embodiment, the co-acid is added before the precursor monomer and the PVPSA, and the oxidizer is added last. In one embodiment the co-acid is added prior to the addition of the precursor monomer, followed by the addition of the PVPSA, and the oxidizer is added last. In one embodiment, the polymerization is carried out in the presence of both a co-dispersing liquid and a co-acid.

In one embodiment, a reaction vessel is charged first with a mixture of water, alcohol co-dispersing agent, and inorganic co-acid. To this is added, in order, the precursor monomer, an aqueous solution or dispersion of PVPSA, and an oxidizer. The oxidizer is added slowly and dropwise to prevent the formation of localized areas of high ion concentration which can destabilize the mixture. In another embodiment, the oxidizer and precursor monomer are injected into the reaction mixture separately and simultaneously at a controlled rate. The mixture is stirred and the reaction is then allowed to proceed at a controlled temperature. When polymerization is completed, the reaction mixture is treated with a strong acid cation resin, stirred and filtered; and then treated with a base anion exchange resin, stirred and filtered. Alternative orders of addition can be used, as discussed above.

In the method of making the new doped conductive polymer, the molar ratio of oxidizer to total precursor monomer is generally in the range of 0.1 to 3.0; and in one embodiment is 0.4 to 1.5. The molar ratio of PVPSA to total precursor monomer is generally in the range of 0.2 to 10. In one embodiment, the ratio is in the range of 1 to 5. The overall solid content is generally in the range of about 0.5% to 12% in weight percentage; and in one embodiment of about 2% to 6%. The reaction temperature is generally in the range of about 4° C. to 50° C.; in one embodiment about 20° C. to 35° C. The molar ratio of optional co-acid to precursor monomer is about 0.05 to 4. The addition time of the oxidizer influences particle size and viscosity. Thus, the particle size can be reduced by slowing down the addition speed. In parallel, the viscosity is increased by slowing down the addition speed. The reaction time is generally in the range of about 1 to about 30 hours.

In some embodiments, the pH of the dispersion is increased. The pH can be adjusted by treatment with cation exchange resins. In some embodiments, the pH is adjusted by the addition of aqueous base solution. Cations for the base can be, but are not limited to, alkali metal, alkaline earth metal, ammonium, and alkylammonium. In some embodiments, alkali metal is preferred over alkaline earth metal cations.

In some embodiments, the dispersion of the doped conductive polymer is blended with other water soluble or dispersible materials. Examples of types of materials which can be added include, but are not limited to polymers, dyes, coating aids, organic and inorganic conductive inks and pastes, charge transport materials, crosslinking agents, and combinations thereof. The other water soluble or dispersible materials can be simple molecules or polymers.

c. Doped Conductive Polymer Composition with Highly-Fluorinated Acid Polymer

In some embodiments, the composition of conductive polymer doped with PVPSA further comprises a highly-fluorinated acid polymer. This composition is prepared by blending the doped conductive polymer with the highly-fluorinated acid polymer. This can be accomplished by adding an aqueous solution or dispersion of the doped conductive polymer to a dispersion or solution of the highly-fluorinated acid polymer. In one embodiment, the composition is further treated using sonication or microfluidization to ensure mixing of the components.

In one embodiment, one or both of the doped conductive polymer and highly-fluorinated acid polymer are isolated in solid form. The solid material can be redispersed in water or in an aqueous solution or dispersion of the other component. For example, doped conductive polymer solids can be dispersed in an aqueous solution or dispersion of a highly-fluorinated acid polymer.

The highly-fluorinated acid polymer ("HFAP") can be any polymer which is highly-fluorinated and has acidic groups with acidic protons. The acidic groups supply an ionizable proton. In some embodiments, the acidic proton has a pKa of less than 3. In some embodiments, the acidic proton has a pKa of less than 0. In some embodiments, the acidic proton has a pKa of less than −5. The acidic group can be attached directly to the polymer backbone, or it can be attached to side chains on the polymer backbone. Examples of acidic groups include, but are not limited to, carboxylic acid groups, sulfonic acid groups, sulfonimide groups, phosphoric acid groups, phosphonic acid groups, and combinations thereof. The acidic groups can all be the same, or the polymer may have more than one type of acidic group. In some embodiments, the acidic groups are selected from the group consisting of sulfonic acid groups, sulfonamide groups, and combinations thereof.

In some embodiments, the HFAP is at least 95% fluorinated; in some embodiments, fully-fluorinated.

In some embodiments, the HFAP is water-soluble. In some embodiments, the HFAP is dispersible in water. In some embodiments, the HFAP is organic solvent wettable. The term "organic solvent wettable" refers to a material which, when formed into a film, possesses a contact angle no greater than 60° C. with organic solvents. In some embodiments, wettable materials form films which are wettable by phenylhexane with a contact angle no greater than 55°. The methods for measuring contact angles are well known. In some embodiments, the wettable material can be made from a polymeric acid that, by itself is non-wettable, but with selective additives it can be made wettable.

Examples of suitable polymeric backbones include, but are not limited to, polyolefins, polyacrylates, polymethacrylates, polyimides, polyamides, polyaramids, polyacrylamides, polystyrenes, and copolymers thereof, all of which are highly-fluorinated; in some embodiments, fully-fluorinated.

In one embodiment, the acidic groups are sulfonic acid groups or sulfonimide groups. A sulfonimide group has the formula:

—SO₂—NH—SO₂—R where R is an alkyl group.

In one embodiment, the acidic groups are on a fluorinated side chain. In one embodiment, the fluorinated side chains are selected from alkyl groups, alkoxy groups, amido groups, ether groups, and combinations thereof, all of which are fully fluorinated.

In one embodiment, the HFAP has a highly-fluorinated olefin backbone, with pendant highly-fluorinated alkyl sulfonate, highly-fluorinated ether sulfonate, highly-fluorinated ester sulfonate, or highly-fluorinated ether sulfonimide groups. In one embodiment, the HFAP is a perfluoroolefin having perfluoro-ether-sulfonic acid side chains. In one embodiment, the polymer is a copolymer of 1,1-difluoroethylene and 2-(1,1-difluoro-2-(trifluoromethyl)allyloxy)-1,1,2,2-tetrafluoroethanesulfonic acid. In one embodiment, the polymer is a copolymer of ethylene and 2-(2-(1,2,2-trifluorovinyloxy)-1,1,2,3,3,3-hexafluoropropoxy)-1,1,2,2-tetrafluoroethanesulfonic acid. These copolymers can be made as the corresponding sulfonyl fluoride polymer and then can be converted to the sulfonic acid form.

In one embodiment, the HFAP is homopolymer or copolymer of a fluorinated and partially sulfonated poly(arylene ether sulfone). The copolymer can be a block copolymer.

In one embodiment, the HFAP is a sulfonimide polymer having Formula IX:

(IX)

where:
R_f is selected from highly-fluorinated alkylene, highly-fluorinated heteroalkylene, highly-fluorinated arylene, and highly-fluorinated heteroarylene, which may be substituted with one or more ether oxygens; and
n is at least 4.

In one embodiment of Formula IX, R_f is a perfluoroalkyl group. In one embodiment, R_f is a perfluorobutyl group. In one embodiment, R_f contains ether oxygens. In one embodiment n is greater than 10.

In one embodiment, the HFAP comprises a highly-fluorinated polymer backbone and a side chain having Formula X:

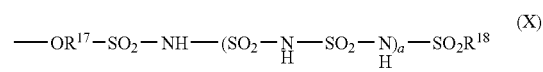

(X)

where:
R¹⁷ is a highly-fluorinated alkylene group or a highly-fluorinated heteroalkylene group;
R¹⁸ is a highly-fluorinated alkyl or a highly-fluorinated aryl group; and
a is an integer from 0 to 4.

In one embodiment, the HFAP has Formula XI:

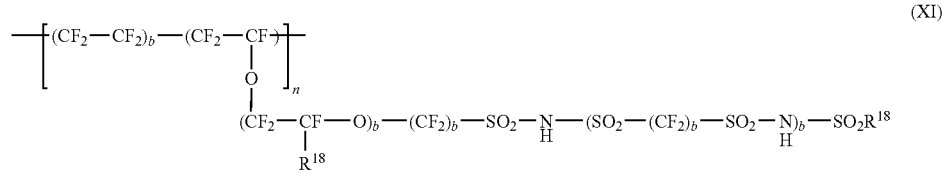

(XI)

where:
R[18] is a highly-fluorinated alkyl or a highly-fluorinated aryl group;
b is independently an integer from 0 to 3; and
n is at least 4.

The synthesis of HFAPs has been described in, for example, A. Feiring et al., J. Fluorine Chemistry 2000, 105, 129-135; A. Feiring et al., Macromolecules 2000, 33, 9262-9271; D. D. Desmarteau, J. Fluorine Chem. 1995, 72, 203-208; A. J. Appleby et al., J. Electrochem. Soc. 1993, 140(1), 109-111; and Desmarteau, U.S. Pat. No. 5,463,005.

In one embodiment, the HFAP also comprises a repeat unit derived from at least one highly-fluorinated ethylenically unsaturated compound. The perfluoroolefin comprises 2 to 20 carbon atoms. Representative perfluoroolefins include, but are not limited to, tetrafluoroethylene, hexafluoropropylene, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a saturated perfluoroalkyl group of from 1 to about ten carbon atoms. In one embodiment, the comonomer is tetrafluoroethylene.

In one embodiment, the HFAP is a colloid-forming polymeric acid. As used herein, the term "colloid-forming" refers to materials which are insoluble in water, and form colloids when dispersed into an aqueous medium. The colloid-forming polymeric acids typically have a molecular weight in the range of about 10,000 to about 4,000,000. In one embodiment, the polymeric acids have a molecular weight of about 100,000 to about 2,000,000. Colloid particle size typically ranges from 2 nanometers (nm) to about 140 nm. In one embodiment, the colloids have a particle size of 2 nm to about 30 nm. Any highly-fluorinated colloid-forming polymeric material having acidic protons can be used. Some of the polymers described hereinabove may be formed in non-acid form, e.g., as salts, esters, or sulfonyl fluorides. They will be converted to the acid form for the preparation of conductive compositions, described below.

In some embodiments, HFAP include a highly-fluorinated carbon backbone and side chains represented by the formula

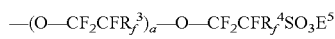

wherein $R_f^3$ and $R_f^4$ are independently selected from F, Cl or a highly-fluorinated alkyl group having 1 to 10 carbon atoms, a=0, 1 or 2, and $E^5$. In some cases $E^5$ can be a cation such as Li, Na, or K, and be converted to the acid form.

In some embodiments, the HFAP can be the polymers disclosed in U.S. Pat. No. 3,282,875 and in U.S. Pat. Nos. 4,358,545 and 4,940,525. In some embodiments, the HFAP comprises a perfluorocarbon backbone and the side chain represented by the formula

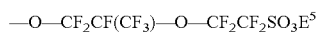

where $E^5$ is as defined above. HFAPs of this type are disclosed in U.S. Pat. No. 3,282,875 and can be made by copolymerization of tetrafluoroethylene (TFE) and the perfluorinated vinyl ether $CF_2=CF-O-CF_2CF(CF_3)-O-CF_2CF_2SO_2F$, perfluoro(3,6-dioxa-4-methyl-7-octenesulfonyl fluoride) (PDMOF), followed by conversion to sulfonate groups by hydrolysis of the sulfonyl fluoride groups and ion exchanged as necessary to convert them to the desired ionic form. An example of a polymer of the type disclosed in U.S. Pat. Nos. 4,358,545 and 4,940,525 has the side chain $-O-CF_2CF_2SO_3E^5$, wherein $E^5$ is as defined above. This polymer can be made by copolymerization of tetrafluoroethylene (TFE) and the perfluorinated vinyl ether $CF_2=CF-O-CF_2CF_2SO_2F$, perfluoro(3-oxa-4-pentenesulfonyl fluoride) (POPF), followed by hydrolysis and further ion exchange as necessary.

One type of HFAP is available commercially as aqueous Nafion® dispersions, from E. I. du Pont de Nemours and Company (Wilmington, Del.).

5. Electronic Devices

In another embodiment of the invention, there are provided electronic devices comprising at least one electroactive layer positioned between two electrical contact layers, wherein the device further includes the new buffer layer. The term "electroactive" when referring to a layer or material is intended to mean a layer or material that exhibits electronic or electroradiative properties. An electroactive layer material may emit radiation or exhibit a change in concentration of electron-hole pairs when receiving radiation.

As shown in FIG. 1, one embodiment of a device, 100, has an anode layer 110, a buffer layer 120, an electroactive layer 130, and a cathode layer 150. Adjacent to the cathode layer 150 is an optional electron-injection/transport layer 140.

The device may include a support or substrate (not shown) that can be adjacent to the anode layer 110 or the cathode layer 150. Most frequently, the support is adjacent to the anode layer 110. The support can be flexible or rigid, organic or inorganic. Examples of support materials include, but are not limited to, glass, ceramic, metal, and plastic films.

The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8-10 transition elements. If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include, but are not limited to, indium-tin-oxide ("ITO"), indium-zinc-oxide, aluminum-tin-oxide, gold, silver, copper, and nickel. The anode may also comprise an organic material, especially a conducting polymer such as polyaniline, including exemplary materials as described in "Flexible light-emitting diodes made from soluble conducting polymer," Nature vol. 357, pp 477 479 (11 Jun. 1992). At least one of the anode and cathode should be at least partially transparent to allow the generated light to be observed.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

In one embodiment, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used.

The buffer layer 120 comprises the conductive polymer doped with a PVPSA, as described above. In some embodiments, the buffer layer comprises the conductive polymer doped with a PVPSA and a HFAP. In some embodiments, the buffer layer consists essentially of a conductive polymer doped with a PVPSA. In some embodiments, the buffer layer consists essentially of a conductive polymer doped with a PVPSA and a HFAP.

An optional layer, not shown, may be present between the buffer layer 120 and the electroactive layer 130. This layer may comprise hole transport materials. Examples of hole transport materials have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules include, but are not limited to: 4,4',4''-tris(N,N-diphenyl-amino)-triphenylamine (TDATA); 4,4',4''-tris(N-3-methylphenyl-N-phenyl-amino)-triphenylamine (MTDATA); N,N'-diphenyl-N,N'-bis(3-methylphenyl)-[1,1'-biphenyl]-4,4'-diamine (TPD); 1,1-bis[(di-4-tolylamino) phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); α-phenyl-4-N,N-diphenylaminostyrene (TPS); p-(diethylamino)benzaldehyde diphenylhydrazone (DEH); triphenylamine (TPA); bis[4-(N,N-diethylamino)-2-methylphenyl] (4-methylphenyl)methane (MPMP); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); N,N'-bis (naphthalen-1-yl)-N,N'-bis-(phenyl)benzidine (α-NPB); and porphyrinic compounds, such as copper phthalocyanine. Commonly used hole transporting polymers include, but are not limited to, polyvinylcarbazole, (phenylmethyl)polysilane, poly(dioxythiophenes), polyanilines, and polypyrroles. In some embodiments, polymers and copolymers of fluorene and triarylamines are used as hole transporting materials. It is also possible to obtain hole transporting polymers by doping hole transporting molecules such as those mentioned above into polymers such as polystyrene and polycarbonate. In some embodiments, the hole transport material can be doped with an electron acceptor material or an electron donor material.

Depending upon the application of the device, the electroactive layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive material is an organic electroluminescent ("EL") material. Any EL material can be used in the devices, including, but not limited to, small molecule organic fluorescent compounds, fluorescent and phosphorescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly (spirobifluorenes), polythiophenes, poly(p-phenylenes), copolymers thereof, and mixtures thereof.

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include, but are not limited to, metal chelated oxinoid compounds, such as bis(2-methyl-8-quinolinolato)(para-phenyl-phenolato)aluminum(III) (BAlQ) and tris(8-hydroxyquinolato)aluminum (Alq$_3$); tetrakis(8-hydroxyquinolinato)zirconium, and tetrakis-(8-hydroxyquinolato)hafnium (HfQ); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and any one or more combinations thereof. In some embodiments, the electron transport material can be doped with an electron acceptor material or an electron donor material.

Alternatively, optional layer 140 may be inorganic and comprise BaO, LiF, Li$_2$O, CsF or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include, but are not limited to, barium, lithium, cerium, cesium, europium, rubidium, yttrium, magnesium, samarium, and alloys and combinations thereof.

The cathode layer 150 is usually formed by a chemical or physical vapor deposition process. In some embodiments, the cathode layer will be patterned, as discussed above in reference to the anode layer 110.

Other layers in the device can be made of any materials which are known to be useful in such layers upon consideration of the function to be served by such layers.

In some embodiments, an encapsulation layer (not shown) is deposited over the contact layer 150 to prevent entry of undesirable components, such as water and oxygen, into the device 100. Such components can have a deleterious effect on the organic layer 130. In one embodiment, the encapsulation layer is a barrier layer or film. In one embodiment, the encapsulation layer is a glass lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110, optional hole transport layer (not shown), the optional electron transport layer 140, cathode layer 150, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; buffer layer 120, 50-2000 Å, in one embodiment 200-1000 Å; electroactive layer 130 10-2000 Å, in one embodiment 100-1000 Å; optional electron transport layer 140, 50-2000 Å, in one embodiment 100-1000 Å; cathode 150, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

The device layers can be formed by any deposition technique, or combinations of techniques, including vapor deposition, liquid deposition, and thermal transfer. Substrates such as glass, plastics, and metals can be used. Conventional vapor deposition techniques can be used, such as thermal evaporation, chemical vapor deposition, and the like. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

In some embodiments, the device is fabricated by liquid deposition of the buffer layer, the hole transport layer, and the photoactive layer, and by vapor deposition of the anode, the electron transport layer, an electron injection layer and the cathode.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

EXAMPLES

General Procedure

This describes the general procedure of film sample preparation, four-probe electrical resistance measurement and calculation of electrical conductivity.

One drop of each dispersion sample was spread on a 3"×1" microscope slide to cover ⅔ area of the slide. Excess of liquid was tilted to one edge of the slide to be soaked-up by a tissue. Once a smooth, homogeneous layer of liquid was ensured, the slide was placed on a flat surface for initial drying at room temperature. The slide was then placed on a hot plate set at about 120° C. in air for 15 minutes. The whole operation was carried out in air (done in Ambient atmosphere). The slide was removed from the hot plate and the film was trimmed to a long strip with a razor blade. Width of the strip ranged from 0.2 cm to 0.7 cm and the length was about 3 cm. Silver paste was then painted perpendicular to the length of the strip to form four electrodes. The two inner parallel electrodes were about 0.2 cm to 0.5 cm apart and were connected to a Keithley model 616 electrometer for measurement of voltage. The two outer parallel electrodes were connected to a Keithley model 225 Current Source. A series of corresponding current/voltage data obtained at room temperature was recorded to see whether Ohm's law was followed. All the samples in the Examples followed Ohm's law, which provided a more or less identical resistance for the corresponding current/voltage data. Once measured was done, the area in the two inner electrodes was measured for thickness with a Profilometer. Thickness is in the range of 1 to 4 micrometer (μm). Since resistance, thickness, separation length of the two inner electrodes and the width of the filmstrip are known, electrical conductivity is then calculated. The conductivity unit is expressed as S (Siemens)/cm.

Example 1

This example illustrates synthesis of poly[3-(4-vinylphenoxy)propane-1-sulfonic acid] ("PVPPSA"), from poly(4-vinylphenol) and 1,3-propanesultone.

Inside the DryBox 5.065 g (42.16 meq —OH) Poly(4-Vinylphenol) [also known as Poly(4-Hydroxystyrene)] was massed into a 125 mL Erlenmeyer Flask. A Stirring Magnet was added and stirring had begun. Methanol was added to the Flask such that the total solution was 98.438 g resulting in a Red Solution that was 5.15% Solids. 6.029 g (42.45 meq) dry Sodium Sulfate was added to the Methanolic Polymer Solution and stirred briefly. The resulting slurry was allowed to stand for almost 22 hr before being Vacuum Filtered through a Coarse Fritted Funnel directly into a 250 mL Round Bottomed Flask. The transfers are assumed to be quantitative. 43 mL (35.1 g Solution, 1.71 g Material, 45.2 meq) of 1.0M (1.05 as per its Certificate of Analysis) Lithium Methoxide/ Methanol Solution was added to the Reaction Flask turning the Solution Deeper Red. This was allowed to stir for 1 hr. Using a PolyPropylene Spatula 5.660 g (46.34 meq) 1,3-Propanesultone was massed onto a piece of Weighing Paper and transferred to the Reaction Mixture. The Reaction Flask was capped with a Stopcock Gas Inlet Adapter before being removed from the DryBox. The Flask was placed into the Hood, Nitrogen attached to the Adapter and stirring commenced. A dried condenser, cooled with a circulation bath was added in between the Inlet Adapter and the Flask. The Flask was then heated with an Oil Bath such that reflux was attained. The Reaction Mixture stirred at reflux for slightly more than 15 hr. This Reaction Mixture was allowed to stand under Nitrogen for about 3 weeks. 11.07 g (3.68 meq 1,3-Propanesultone) of the Reaction Mixture was massed into a 30 mL Plastic Nalgene Bottle. 1.57 g (7.38 meq $H^+$) of Amberlyst-15, previously rinsed with Methanol/DI Water, was massed into the bottle and the resulting slurry was rolled for 1 hr. The slurry was then separated through a Coarse Fritted Funnel. The Resin Beads were rinsed with approximately 3 "Bed volumes" of Methanol with the washings retained and transferred to an appropriately sized Nalgene® Plastic Bottle. 1.57 g (7.38 meq $H^+$) of Amberlyst-15 and 6.00 g (7.38 meq OH), both previously rinsed with Methanol/DI Water, was each massed into the bottle and the resulting slurry was rolled for 4 hr. This slurry was then separated through a Coarse Fritted Funnel. The Resin Beads were rinsed with approximately 3 "Bed volumes" of Methanol with the washings retained and transferred to an appropriately sized Nalgene Plastic Bottle. A second treatment with the Resin Mixture was performed as above. One final treatment with Amberlyst 15 was performed as above. All transfers are assumed to be quantitative.

The final solution was evaporated, yielding a reddish solid. The material was confirmed by NMR analysis and ion chromatography data to be poly[3-(4-vinylphenoxy)propane-1-sulfonic acid], with 99.6% conversion to free acid form.

Example 2

This example illustrates the polymerization of 3,4-ethylenedioxythiophene in the presence of PVPPSA, to form a doped conductive polymer: poly(3,4-dethylenedioxythiophene)/poly[3-(4-vinylphenoxy)propane-1-sulfonic acid] ("PEDOT/PVPPSA").

0.65 g of Iron(III) sulfate was massed directly into a 125 mL Nalgene Plastic Bottle. The solid was then diluted to 100.00 g with DI Water and the bottle capped. The bottle was then vigorously shaken by hand to complete dissolution. Density was measured to be 1.00 g/mL for solutions of this ilk. This is known as Solution A.

4.58 g of PVPSSA from Example 1 was massed directly into a 125 mL Nalgene Plastic Bottle. The Poly(Acid) was then diluted to 45.82 g with DI Water, yielding a $9.99_6$% solution if a completely dry solid is assumed. Stirring was done magnetically. This is known as Solution B.

3,4-Ethylenedioxythiophene was passed though Basic Alumina using a Glass Transfer Pipette and a plug of Glass Wool as a column. This resulted in a slightly colored viscous liquid.

26.20 g of Solution B (2.619 g Solid Poly[Acid], 10.81 meq assuming complete conversion AND small end-groups) was massed directly into a 125 mL Erlenmeyer Flask. 221.31 g of DI Water was then massed directly into the Flask. A Stirring Magnet was added and stirring begun. Using a micropipette 0.288 mL (0.384 g, 2.70 meq) of purified EDOT was then added to the Flask. Once the EDOT droplets were deemed to be small and well-dispersed, 0.77 g Sodium Persulfate (3.23 meq) was massed onto a piece of weighing paper and transferred to the Reaction Mixture. It is assumed that this transfer was quantitative.

Using a micropipette, 2.150 mL (2.150 g Solution, 0.0140 g Solute, 0.027 meq) of Solution A was transferred to the Reaction Mixture. This begins the Reaction. The color of the Reaction Mixture started as a light green, became grey and then finally blue and opaque. After 24 hr of stirring, the Reaction Mixture was transferred to a 250 mL Nalgene Plastic Bottle containing a mixture of 6.72 g Lewatit MP 62 (previously rinsed with DI Water) and 6.72 g Lewatit S100 Sodium Form (previously rinsed with DI Water). The resulting Slurry was rolled for 5 hr before being vacuum filtered through a 125 mm Buchner Funnel equipped with a single piece of Whatman #4 Filter Paper. Filtration was fairly rapid. The dark blue filtrate was transferred to a 250 mL Nalgene Plastic Bottle. The yield was 229.82 g, resulting in a Dispersion that is theoretically 1.2% Solids.

The pH of this dispersion was measured to be 4.4 using a Jenco Benchtop Analog Display pH Meter in conjunction with a Denver Instruments Plastic Body Gel Filled pH Combination Electrode standardized by using a pH7 Buffer and a pH1 Buffer. Electrical conductivity at room temperature based on the resistance of five samples is $0.9 \times 10^{-3}$ S/cm, $1.5 \times 10^{-3}$ S/cm, $1.5 \times 10^{-3}$ S/cm, $1.7 \times 10^{-3}$ S/cm, and $1.6 \times 10^{-3}$ S/cm.

Example 3

This example illustrates polymerization of pyrrole ("Py") in the presence of PVPPSA to form a doped conductive polymer: polypyrrole/poly[3-(4-vinylphenoxy)propane-1-sulfonic acid] ("PPy/PVPPSA").

0.65 g of Iron(III) sulfate was massed directly into a 125 mL Nalgene Plastic Bottle. The solid was then diluted to 100.03 g with DI Water and the bottle capped. The bottle was then vigorously shaken by hand to complete dissolution. Density was measured to be 1.00 g/mL for solutions of this ilk. This is known as Solution A.

Pyrrole was passed though Basic Alumina using a Glass Transfer Pipette and a plug of Glass Wool as a column. This removed the Brown Color. Using a micropipette 0.306 mL (0.296 g) of the eluted Pyrrole was transferred to a Scintillation Vial. This material was then diluted to 11.36 g, resulting in a 2.605% Solution. The Density of this solution was measured to be 1.00 g/mL. Using a Teflon Needle the solution in its entirety was transferred to a 20 mL Norm-Ject Plastic Syringe. The air-bubble was removed. This syringe was then placed into a Harvard Apparatus PHD 22/2000 Syringe Pump.

19.44 g of Solution B from Example 2 (1.943 g Solid Poly[Acid], 8.02 meq assuming complete conversion AND small end-groups) was massed directly into a 300 mL Erlenmeyer Flask. 86.01 g of DI Water was then massed directly into the Flask. A Stirring Magnet was added and stirring began.

Using a Graduated Cylinder, 32 mL (32 g Solution, 0.208 g, 0.402 meq) of Solution A was transferred to the Reaction Mixture. 0.95 g Sodium Persulfate (3.99 meq) was massed onto a piece of weighing paper and transferred to the Reaction Mixture. It is assumed that this transfer was quantitative.

The Teflon Needle was pointed into the Reaction Flask and the Syringe Pump started its feed. The pump was set to deliver 10.33 mL (10.33 mL solution, 0.269 g Solute, 4.01 meq) over the course of 1:50 (m:ss). The end of the Pyrrole Injection is the starting point of this reaction. 7 min into the Reaction the color of the Reaction Mixture was Dark Green. After 24 hr of stirring, the Reaction Mixture was transferred to a 250 mL Nalgene Plastic Bottle containing a mixture of 2.35 g Lewatit MP 62 (previously rinsed with DI Water) and 2.35 g Lewatit S100 Sodium Form (previously rinsed with DI Water). The resulting Slurry was rolled for 1 almost 20 hr before being vacuum filtered through a 125 mm Buchner Funnel equipped with a single piece of Whatman #4 Filter Paper. Filtration was fairly rapid. The dark blue filtrate was transferred to a 250 mL Nalgene Plastic Bottle. The yield was 137.40 g, resulting in a Dispersion that is theoretically 1.5% Solids.

The pH of this dispersion was measured to be 3.0 using a Jenco Benchtop Analog Display pH Meter in conjunction with a Denver Instruments Plastic Body Gel Filled pH Combination Electrode standardized by using a pH 7 Buffer and a pH 1 Buffer. Electrical conductivity at room temperature based on the resistance of two samples is $1.2 \times 10^{-2}$ S/cm and $0.5 \times 10^{-2}$ S/cm.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination.

The use of numerical values in the various ranges specified herein is stated as approximations as though the minimum and maximum values within the stated ranges were both being preceded by the word "about." In this manner slight variations above and below the stated ranges can be used to achieve substantially the same results as values within the ranges. Also, the disclosure of these ranges is intended as a continuous range including every value between the minimum and maximum average values including fractional values that can result when some of components of one value are mixed with those of different value. Moreover, when broader and narrower ranges are disclosed, it is within the contemplation of this invention to match a minimum value from one range with a maximum value from another range and vice versa.

What is claimed is:

1. A vinylphenoxy polymer having at least one monomeric unit selected from the group consisting of Formula Ib and Formula Ic:

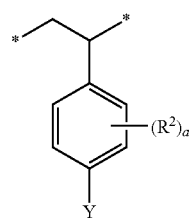

Formula Ia

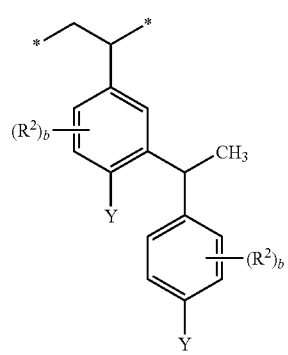

Formula Ib

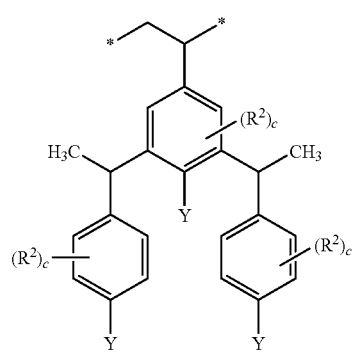

Formula Ic wherein:
    Y is —OR$^1$SO$_3$Z;
    R$^1$ is an alkylene group having 1-10 carbon atoms;
    R$^2$ is the same or different at each occurrence and is selected from the group consisting of alkyl groups and alkoxy groups;
    Z is selected from the group consisting of H and Group 1 metal cations;
    b is an integer from 0 to 3; and
    c is an integer from 0 to 2.

2. The vinylphenoxy polymer of claim 1, wherein the polymer is a homopolymer.

3. The vinylphenoxy polymer of claim 1, wherein the polymer is a copolymer with at least one additional monomeric unit selected from the group consisting of styrene sulfonic acid, acrylamidomethansulfonic acid, and sulfonated acrylates and methacrylates.

4. The vinylphenoxy polymer of claim 1, wherein R$^1$ has 3-5 carbon atoms.

5. The vinylphenoxy polymer of claim 1, wherein b=c=0.

6. The vinylphenoxy polymer of claim 1, wherein Z is selected from H and Li.

7. The vinylphenoxy polymer of claim 1 having Formula Ib, wherein b=1 and R$^2$ is an alkyl having 1-10 carbons.

8. The vinylphenoxy polymer of claim 1 having Formula Ic, wherein c=1 and $R^2$ is an alkyl having 1-10 carbons.

9. A composition comprising an electrically conductive polymer doped with a vinylphenoxy sulfonic acid polymer having at least one monomeric unit selected from the group consisting of Formula Ib and Formula Ic:

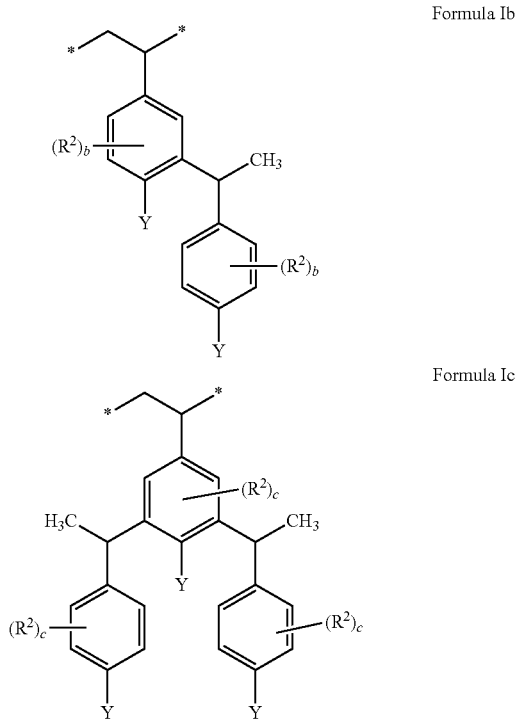

Formula Ib

Formula Ic wherein:

Y is —$OR^1SO_3Z$;

$R^1$ is an alkylene group having 1-10 carbon atoms;

$R^2$ is the same or different at each occurrence and is selected from the group consisting of alkyl groups and alkoxy groups;

Z is H;

b is an integer from 0 to 3; and c is an integer from 0 to 2.

10. The composition of claim 9, wherein the electrically conductive polymer is selected from the group consisting of polythiophenes, poly(selenophenes), poly(tellurophenes), polypyrroles, polyanilines, poly(4-amino-indoles), poly(7-amino-indoles), and polycyclic aromatic polymers.

11. The composition of claim 10, wherein the electrically conductive polymer is selected from the group consisting of unsubstituted polyaniline, poly(3,4-ethylenedioxythiophene), poly(3,4-ethyleneoxythiathiophene), poly(3,4-ethylenedithiathiophene), unsubstituted polypyrrole, poly(thieno(2,3-b)thiophene), poly(thieno(3,2-b)thiophene), and poly(thieno(3,4-b)thiophene).

12. The composition of claim 9, further comprising a highly-fluorinated acid polymer.

13. The composition of claim 12, wherein the highly-fluorinated acid polymer is at least 95% fluorinated.

14. The composition of claim 12, wherein the highly-fluorinated acid polymer is selected from a sulfonic acid and a sulfonimide.

15. The composition of claim 12, wherein the highly-fluorinated acid polymer is a perfluoroolefin having perfluoro-ether-sulfonic acid side chains.

16. The composition of claim 12, wherein the highly-fluorinated acid polymer is selected from the group consisting of a copolymer of 1,1-difluoroethylene and 2-(1,1-difluoro-2-(trifluoromethyl)allyloxy)-1,1,2,2-tetrafluoroethanesulfonic acid and a copolymer of ethylene and 2-(2-(1,2,2-trifluorovinyloxy)-1,1,2,3,3,3-hexafluoropropoxy)-1,1,2,2-tetrafluoroethanesulfonic acid.

17. The composition of claim 12, wherein the highly-fluorinated acid polymer is selected from a copolymer of tetrafluoroethylene and perfluoro(3,6-dioxa-4-methyl-7-octenesulfonic acid), and a copolymer of tetrafluoroethylene and perfluoro(3-oxa-4-pentenesulfonic acid).

18. An organic electronic device comprising an anode, a buffer layer, an electroactive layer, and a cathode, wherein the buffer layer comprises the composition of claim 9.

19. An organic electronic device comprising an anode, a buffer layer, an electroactive layer, and a cathode, wherein the buffer layer comprises the composition of claim 12.

* * * * *